US012805319B2

(12) United States Patent
Kertesz et al.

(10) Patent No.: US 12,805,319 B2
(45) Date of Patent: Nov. 17, 2026

(54) CONTAINER FOR ELECTRONIC COMPONENT(S) AND ASSOCIATED ELECTRONIC ASSEMBLY OF PARTS

(71) Applicant: THALES, Courbevoie (FR)

(72) Inventors: Philippe Kertesz, Elancourt Cedex (FR); Pedro Rodrigues, Elancourt Cedex (FR); Franck Vouzelaud, Elancourt Cedex (FR)

(73) Assignee: THALES, Courbevoie (FR)

( * ) Notice: Subject to any disclaimer, the term of this patent is extended or adjusted under 35 U.S.C. 154(b) by 553 days.

(21) Appl. No.: 18/182,327

(22) Filed: Mar. 11, 2023

(65) Prior Publication Data

US 2023/0298968 A1 Sep. 21, 2023

(51) Int. Cl.
*H10W 40/47* (2026.01)

(52) U.S. Cl.
CPC .................................. *H10W 40/47* (2026.01)

(58) Field of Classification Search
CPC ...... H01L 23/473; H01L 23/057; H01L 23/04
See application file for complete search history.

(56) References Cited

U.S. PATENT DOCUMENTS 5,801,442 A * 9/1998 Hamilton .............. H01L 23/473 257/E23.098
5,998,240 A * 12/1999 Hamilton .............. H01L 23/473 257/E23.098
2003/0019234 A1 1/2003 Wayburn et al.
2004/0060689 A1 * 4/2004 Pfeifer ...................... F28F 3/12 257/E23.098
2004/0190253 A1 * 9/2004 Prasher ................. H01L 23/427 361/699
2017/0043437 A1 * 2/2017 Boday ................ H05K 7/20772
2017/0045300 A1 * 2/2017 Boday ................ H05K 7/20772
2018/0320993 A1 * 11/2018 Parag ......................... F28F 3/02
2021/0222967 A1 * 7/2021 Vanderwees ........ H01L 21/4882

FOREIGN PATENT DOCUMENTS

DE 102010041714 A1 8/2011

OTHER PUBLICATIONS

FR 2202355, INPI Rapport de Recherche Preliminaire, Nov. 30, 2022, 2 pages.

* cited by examiner

*Primary Examiner* — Adam B Dravininkas
(74) *Attorney, Agent, or Firm* — Soquel Group LLC

(57) ABSTRACT

Embodiments of the present invention provide a case for packaging electronic component(s), forming a housing intended to receive at least one electronic component, including a support wall including an inner face suitable for receiving the electronic component(s), and an outer face. The case further includes a microfluidic cooling device inserted into the support wall. The microfluidic cooling device includes at least one channel for circulation of a heat-transfer fluid connected to a first inlet port for the heat-transfer fluid and to a second outlet port for the heat-transfer fluid. The cooling device includes at least one platform for receiving the electronic component(s) in contact with the at least one channel for the circulation of a heat-transfer fluid.

11 Claims, 9 Drawing Sheets

CONTAINER FOR ELECTRONIC COMPONENT(S) AND ASSOCIATED ELECTRONIC ASSEMBLY OF PARTS

REFERENCE TO RELATED APPLICATION

This application is a U.S. non-provisional application claiming the benefit of French Application No. 22 02355, filed on Mar. 17, 2022, the contents of which are incorporated herein by reference in their entirety.

TECHNICAL FIELD OF THE INVENTION

The present invention relates to a case (or container) for packaging, preferentially, electronic component(s), and an associated electronic assembly.

The invention belongs to the field of microelectronic components, and more specifically to the field of packaging of such components.

BACKGROUND OF THE INVENTION

The packaging of electronic components, in particular containing semiconductors, simply called semiconductor components, is generally made of homogeneous materials (metal, ceramic, plastic), one or a plurality of such components being packaged in a container or case, made of a homogeneous material, which includes one or a plurality of connections linking the inside of the package to the outside, in order to make the connection of the semiconductor component(s) in a circuit. Packaging encompasses the functions of isolation, connection, thermal management and physical protection of the semiconductor component(s).

The electrical operation of semiconductor components is accompanied by heating related to the electrical efficiency thereof or to the power dissipated. More particularly, in the field of microwave microelectronics, e.g., in the case of microwave power amplifiers, a high-power density is produced by the components, and hence a strong heating of the component or components is observed.

The rise in temperature affects performance of the semiconductor component and leads to the phenomenon of expansion of materials. In addition, the rise in temperature can enhance phenomena of metallurgical and/or electrochemical diffusion, which might accelerate aging or reduce the reliability of the packaged semiconductor component. Such phenomena of reliability are conventionally modeled according to Arrhenius's law.

There is thus a need for heat dissipation, which is known and taken into consideration in the field of packaging of semiconductor components. Generally, the heat-flow generated by the semiconductor components is discharged by thermally connecting the semiconductor component(s) to high thermal conductivity elements inside the case, the case being assembled on a so-called "cold plate" structure which dissipates heat. Thus, the heat-flow generated by the semiconductor component(s) travels through a plurality materials and interfaces. The increase in temperature is thus related to the geometry of the assembly, to the materials used and to the interfaces which create additional thermal resistance opposing the heat-flow.

It is desirable to reduce, or even eliminate, thermal resistances which reduce the efficiency of the discharge of the heat-flow generated by the semiconductor components.

SUMMARY OF THE INVENTION

To this end, the invention proposes, according to one aspect, a case for packaging electronic component(s), the case forming a housing intended for receiving at least one electronic component, including a first wall supporting the at least one electronic component, lateral edges and a second closure wall of the case, the first and second walls and the lateral edges being made of a first material, and including at least one electrical connection element extending towards the outside of the case, the first support wall including an inner face suitable for receiving the electronic component (s), and an outer face. The case includes a microfluidic cooling device made of a second material, inserted into the first support wall, the micro-fluidic cooling device including at least one channel for the circulation of a heat-transfer fluid connected to a first inlet port for the heat-transfer fluid and to a second outlet port for the heat-transfer fluid, the cooling device including at least one platform for receiving the electronic component(s) in contact with the at least one channel for the circulation of a heat-transfer fluid.

Advantageously, the proposed case includes a microfluidic cooling device made of a second material, inserted into the first support wall, for positioning the semiconductor component or components in direct contact with the cooling device through which the heat-transfer fluid travels.

Advantageously, the discharge of the heat-flow generated by the semiconductor component(s) is improved by means of the contact having a low thermal resistance.

The case for packaging electronic component(s) according to embodiments of the invention may further have one or a plurality of the features below, taken independently or according to all technically feasible combinations.

The cooling device is attached by brazing to the first support wall.

The second material from which the cooling device is made is silicon.

The case includes a heat exchanger wherein the at least one channel for the circulation of a heat-transfer fluid is formed by micro-machining.

The heat exchanger includes fins arranged in parallel, channels for the circulation of a heat-transfer fluid being formed between the fins, or pins arranged in a regular pattern, channels for the circulation of a heat-transfer fluid being formed between the pins.

The first material is a ceramic or metallic material or a composite material.

The at least one platform is inserted as a protrusion on the inner face of the first support wall, the first and second ports opening towards the outer face of the first support wall.

The platform has dimensions substantially equal to the dimensions of an electronic component, the electronic component being brazed or bonded to the platform.

According to another aspect, the invention relates to an electronic assembly including at least one case integrating a cooling device as briefly described hereinabove, and a support structure integrating the hydraulic distribution in the case, the or each case including an electronic component, either brazed or bonded to the inside of the case, in contact with the cooling device.

According to one variant, the support structure includes channels for distribution of heat-transfer fluid, one of the heat-transfer fluid distribution channels being connected to the first inlet ports of each cooling device, and another of the heat-transfer fluid distribution channels being connected to the second outlet ports of each cooling device, the or each case being bonded by the outer face of the first support wall to the support structure.

BRIEF DESCRIPTION OF THE DRAWINGS

Other features and advantages of the invention will be clear from the description thereof which is given below as a non-limiting example, with reference to the enclosed figures, among which.

DETAILED DESCRIPTION OF EMBODIMENTS

An embodiment of a case for packaging electronic component(s), e.g. containing semiconductor(s), will be described herein with reference to FIGS. 1-3.

These figures show a case 2 for packaging an electronic component, e.g. containing semiconductor(s) 4, referred to simply as component 4 hereinafter in the description, which is, e.g., a microelectronic component, commonly called an "electronic chip".

An electronic assembly 6 is produced by packaging component 4 in case 2.

Figure 1:
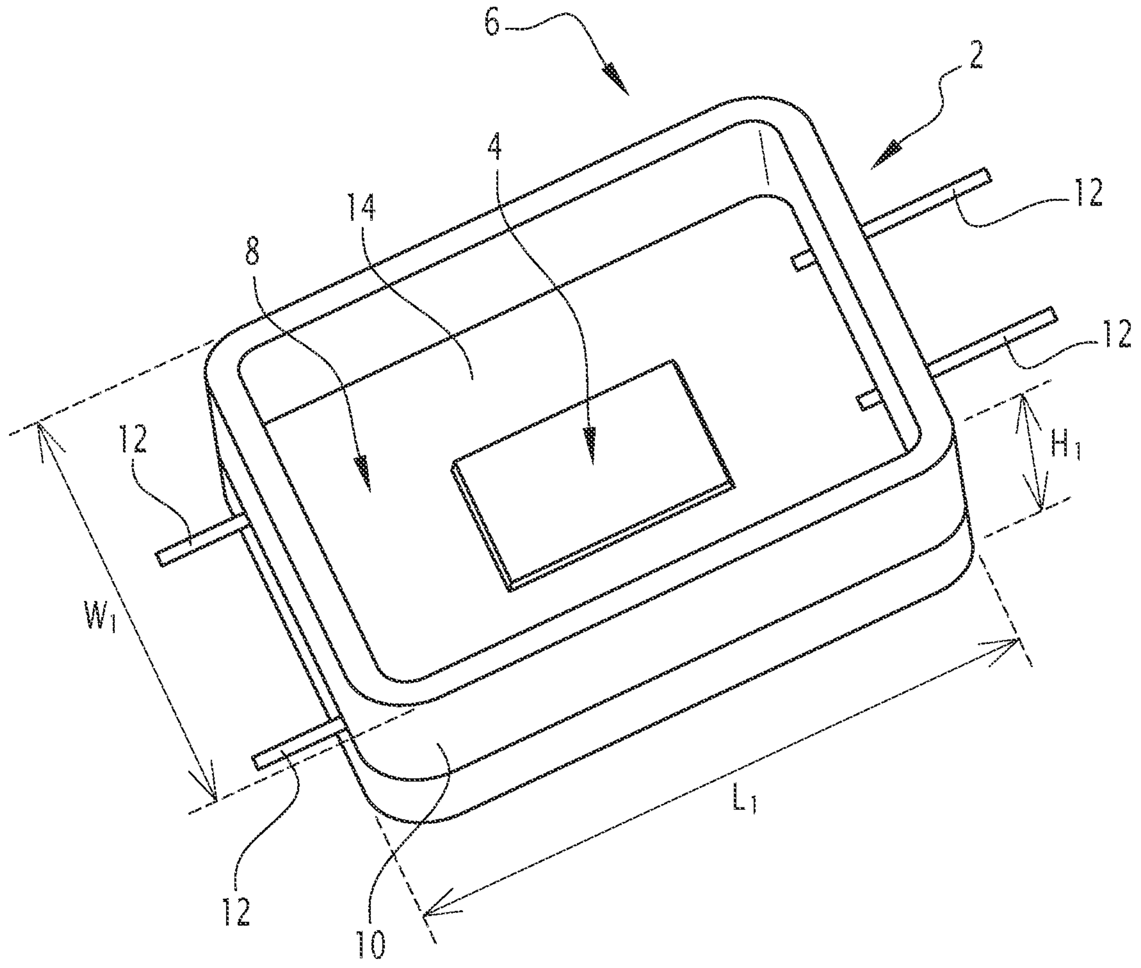
FIG. 1 schematically shows a first view of a case for semiconductor components in one embodiment.
Figure 3:
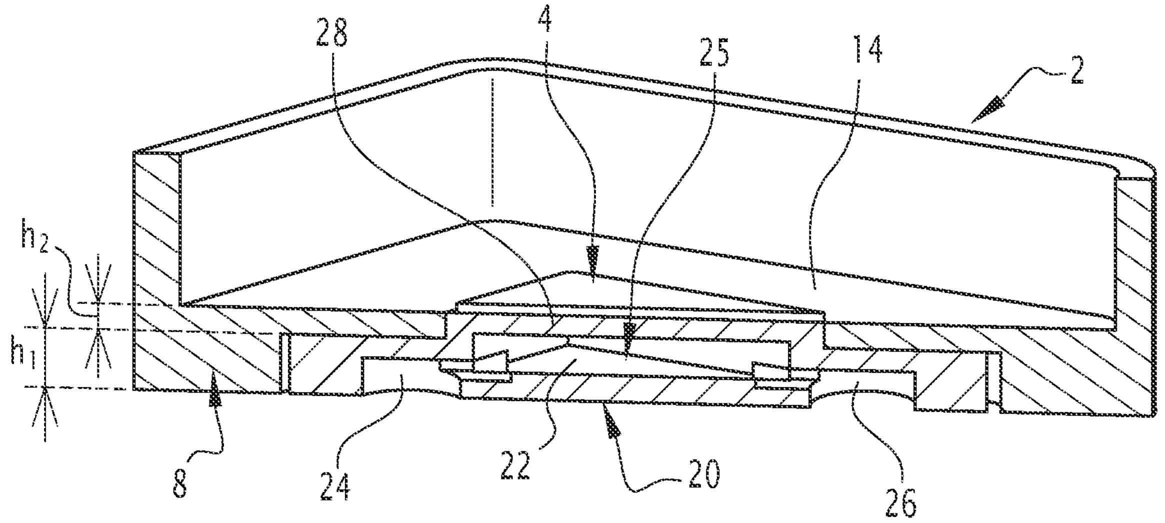
FIG. 3 schematically shows a third view of a case for semiconductor components in one embodiment.

Case 2 is shown open in FIGS. 1 and 3, but the case further includes a lid (not shown) configured for packaging component 4, for protecting same, in particular for providing imperviousness to moisture.

Case 2 has a parallelepipedal shape and includes a first support wall 8 with rectangular shape, e.g. with rounded edges, of dimensions which are the length L1 thereof and the width W1 thereof respectively.

In one embodiment, length L1 and width W1 are on the order of ten millimeters.

Case 2 further includes lateral edges 10 with a height H1 on the order of a few millimeters.

Case 2 further includes a second closing wall (wall forming a lid), not shown.

The first and second walls and the lateral edges form an interior space of the case.

Conventionally, the first and second walls and the lateral edges are made of a first material, e.g. ceramic, metal, or composite material.

In one embodiment of the invention, first support wall 8 is partially made of the first material as described in greater detail herein.

Case 2 further includes electrical connection elements 12, e.g. metal "lugs", protruding outwards, in the present example, from two opposite lateral edges.

The number of connection elements depends on the functions of component 4.

First support wall 8 has an inner face 14, inside the case, and an outer face 16.

Case 2 includes a microfluidic cooling device 20, which is inserted into first support wall 8.

Microfluidic cooling device 20 includes at least one channel 22 for circulation of a heat-transfer fluid, being a part of a heat exchanger 25 etched on a surface of the cooling device opening onto inner face 14 of support wall 8.

The constituent elements of the microfluidic cooling device have micrometric dimensions.

Figure 4:
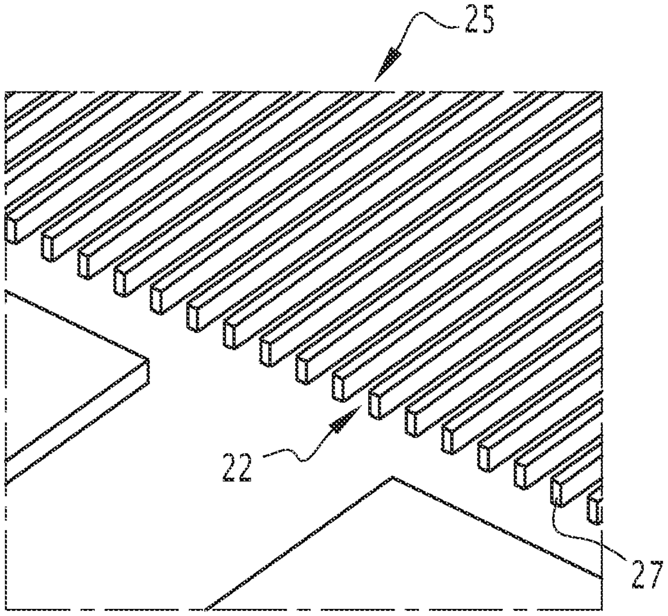
FIG. 4 is a schematic representation of a micro-fluidic heat exchanger with fins.

In an embodiment schematically illustrated in FIG. 4, heat exchanger 25 includes a plurality of channels 22 formed by micrometric fins 27 arranged in parallel, the space between two parallel fins forming a channel.

Figure 5:
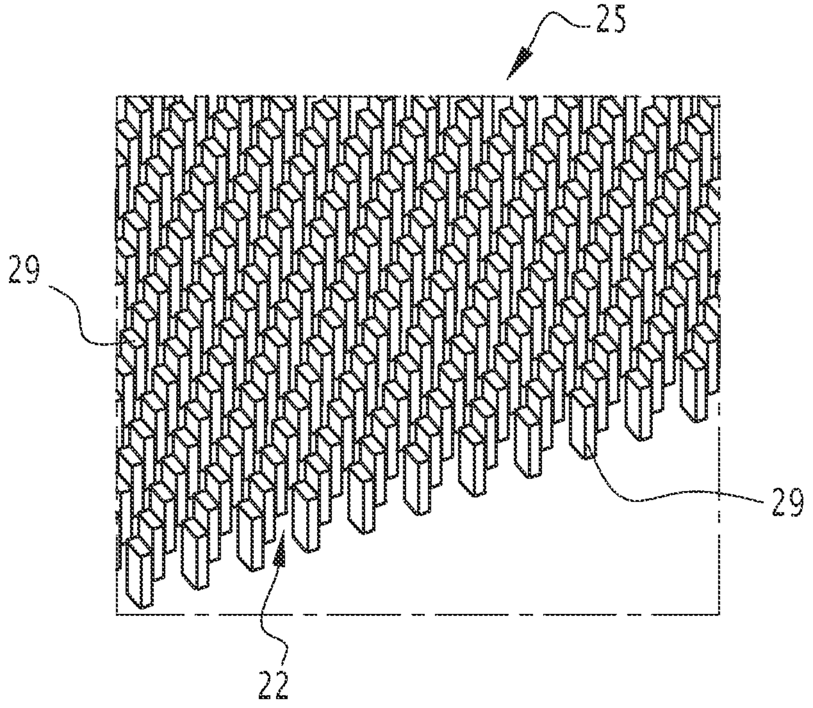
FIG. 5 is a schematic representation of micro-fluidic heat exchanger with pins.

According to a variant, schematically illustrated in FIG. 5, heat exchanger 25 includes protruding micrometric pins 29 arranged in a regular pattern, e.g. spaced apart by a first distance along a first direction, and spaced apart by a second distance along a second direction, orthogonal to the first direction. Pins 29 are, e.g., arranged in a staggered configuration. Channels 22 for circulation of the heat-transfer fluid are formed between pins 29.

The heat-transfer fluid is, e.g., a mixture of antifreeze, Coolanol® or Poly Alpha Olefins (PAOs).

Cooling device 20 includes a first inlet port 24 for the heat-transfer fluid and a second outlet port 26 for the heat-transfer fluid, the ports opening onto outer face 16 of support wall 8 of case 2.

Ports 24, 26, e.g., have a circular shape and a diameter on the order of a few millimeters, e.g. 2 to 4 mm.

Cooling device 20 is made of a second material, which is preferentially silicon.

Advantageously, silicon has a coefficient of expansion on the order of 5 μm/m·K (micrometers per meter per Kelvin), which provides good thermomechanical compatibility with silicon carbide (SiC) or silicon (Si) semiconductors.

Preferentially, cooling device 20 is attached by brazing to support wall 8.

When the second material is silicon, a brazing material is added, e.g., gold or a tin-gold alloy, which has the advantage of having a melting temperature of 280° C. Any other metal alloy, preferentially having a low melting temperature, may be used.

According to a variant, cooling device 20 is attached to support wall 8 by adhesive bonding, e.g., using an organic mixture which hardens after heating, which maintains a contact between cooling device 20 and support wall 8.

Figure 2:
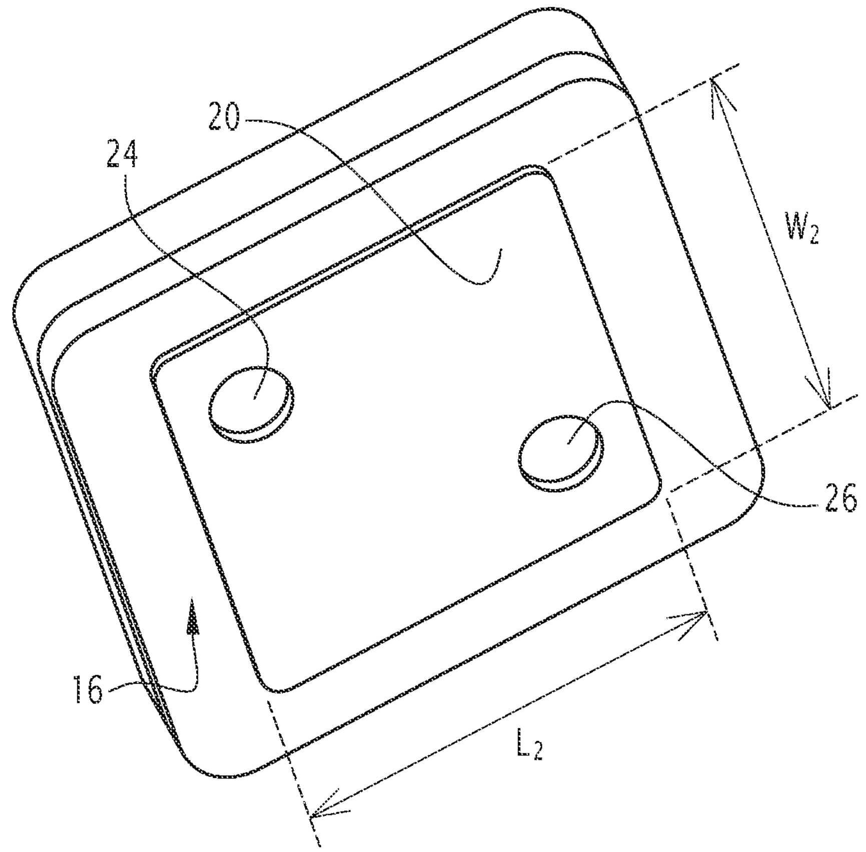
FIG. 2 schematically shows a second view of a case for semiconductor components in one embodiment.

In the embodiment illustrated in FIGS. 1-3, cooling device 20 is inserted into support wall 8.

Cooling device 20 includes a platform 28 located inside case 2, in the extension of inner face 14 of support wall 8, on which component 4 is placed.

For example, platform 28 for receiving component(s) 4 has a parallelepipedal geometric shape, protruding towards the inside of the case, forming a promontory for receiving a component 4.

Preferentially, component 4 is brazed to platform 28.

Cooling device 20 has a substantially parallelepipedal shape, with a base of length L2, width W2, and height H2=h1+h2, h2 being the height of platform 28 as illustrated in FIG. 3. Height h2 is e.g. less than 1 mm.

The length and width dimensions are chosen according to the length and width dimensions of the component 4 to be positioned on cooling device 20, as shown more clearly in FIG. 3.

Advantageously, when the dimensions of platform 28 are equal to or substantially equal to the dimensions of component 4 to be brazed thereto, the heat exchange surface with cooling device 20 is maximized.

Case 2 thus produced includes a cooling device 20 inserted into first support wall 8.

Inserted cooling device 20 is mechanically decoupled from the structure of case 2.

Case 2 then includes a support wall 8 made of two distinct materials, the first material being, e.g., ceramic or metal-ceramic, and the second material being, e.g., silicon.

Cooling device 20 is, e.g., produced by micro-machining by chemical etching.

As an alternative, cooling device 20 is produced by an additive manufacturing technique such as SLS (Selective Laser Sintering).

In the embodiment described with reference to FIGS. 1-3, the packaging case includes a platform for packaging of a semiconductor component.

As an alternative (not shown), it is possible to design the insertion, into support wall 8 of case 2, of a cooling device 20 with two or a plurality of platforms for brazing two or a plurality of semiconductor components.

According to another variant, at least one of the dimensions of the platform of cooling device 20 is enlarged so as to accommodate a plurality of components, the heat exchanger being adapted accordingly.

Figure 6:
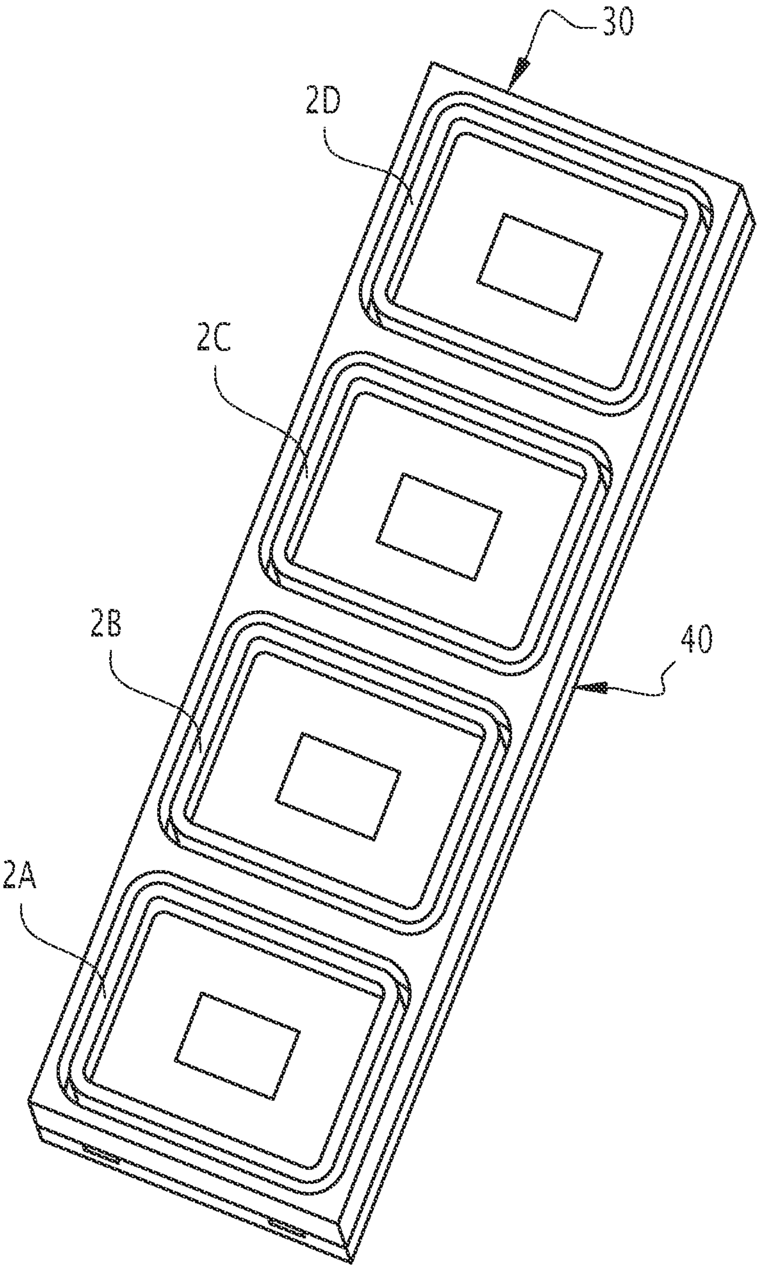
FIG. 6 schematically represents a first view of an electronic assembly with N=4 cases for packaging semiconductor components.
Figure 7:
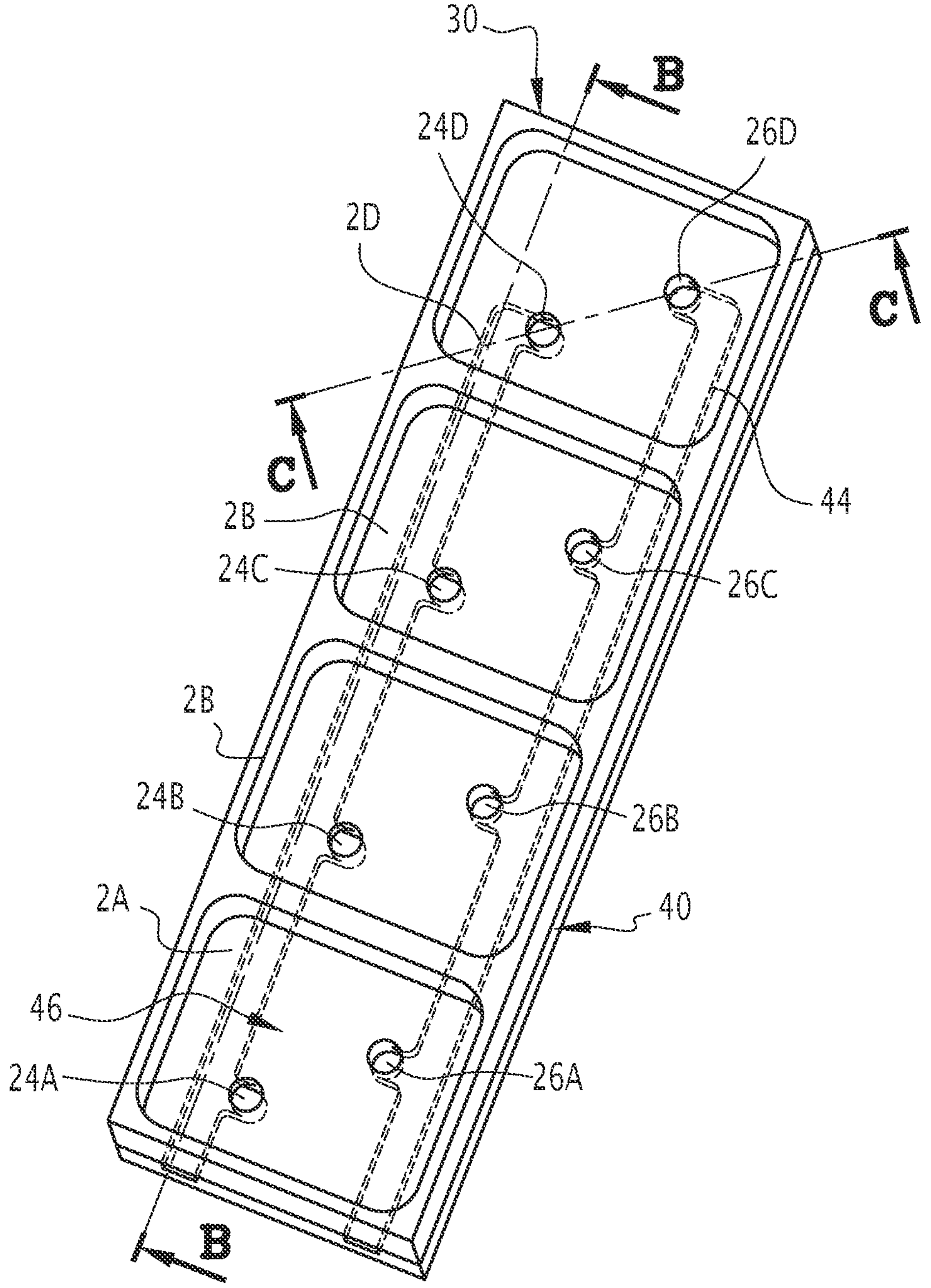
FIG. 7 schematically represents a second view of the electronic assembly shown in FIG. 6.
Figure 8:
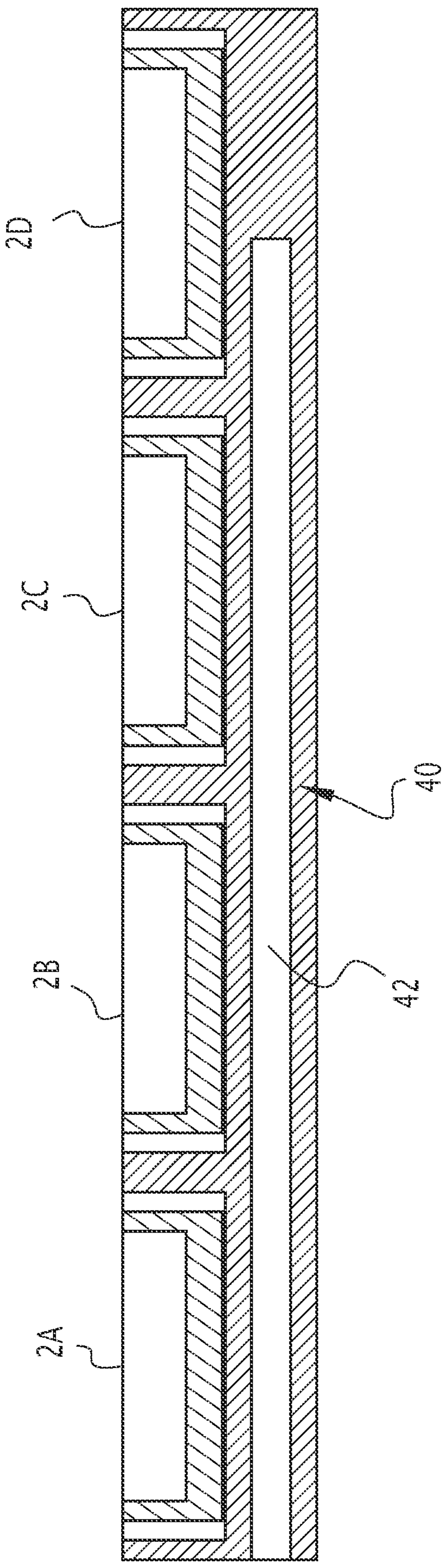
FIG. 8 schematically represents the electronic assembly shown in FIG. 7, in a sectional view along the section B-B, and FIG. 9 schematically shows the electronic assembly shown in FIG. 7, in a sectional view along the section C-C.

FIGS. 6-8 schematically illustrate an electronic assembly of N=4 component packaging cases, e.g., containing semiconductors, mounted on an item of equipment (not shown).

Of course, the number N=4 is given as an example, the invention applying in the same way to any number N of component packaging cases.

Assembly 30 includes 4 cases denoted by 2A, 2B, 2C, 2D of the type described hereinabove, assembled on a support structure 40 integrating the fluid distribution (or fluidic distribution) of heat-transfer fluid.

In FIG. 8, assembly 30 containing support structure 40 integrating a fluid distribution is shown in a section.

Each of cases 2A, 2B, 2C, 2D is analogous to case 2 described hereinabove, and includes a microfluidic cooling device, and is suitable for receiving one or a plurality of components on the dedicated platform of the corresponding cooling device.

Support structure 40 integrating a fluid distribution is, e.g., a metal part on which the cases are assembled, including a machined part suitable for distributing the heat-transfer fluid. Fluid distribution takes place through channels 42 and 44, called heat-transfer fluid distribution channels, which are machined in the thickness of part 40.

Support structure 40 is made, e.g., of aluminum if minimizing the mass is desired. In a variant, support structure 40 is made of composite materials.

Channels 42, 44 for distributing heat-transfer fluid, correspondingly connected to respective first inlet ports 24A, 24B, 24C, 24D and second outlet ports 26A, 26B, 26C, 26D for the heat-transfer fluid, let the heat-transfer fluid circulate in each heat exchanger of each case. Thus, all components 4 inserted into cases 2A-2D are cooled at the same time.

Each case 2A, 2B, 2C, 2D has an outer face of a flat support wall, the faces forming a flat surface 46.

Advantageously, the above enables surface 46 to be bonded to support structure 40 integrating the hydraulic distribution, e.g., by using a gold finish forming a local seal. The bonding provides a seal between the cases and the fluid system support.

Figure 9:
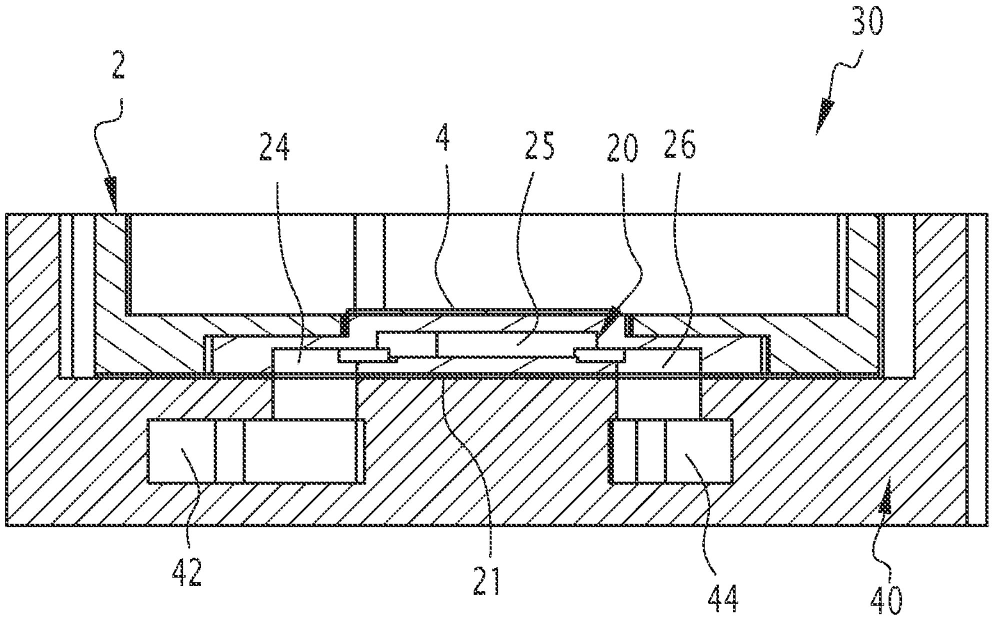

FIG. 9 is a view along the section C-C (FIG. 7) which illustrates in section, one of the cases, herein identified by reference 2, packaging a component 4 which is part of assembly 30.

Section C-C passes through respective ports 24 and 26, as may be seen in FIG. 7.

In addition, FIG. 9 shows an adhesive seal 21 for attaching case 2 to support structure 40 integrating the fluid distribution (channels 42, 44) of heat-transfer fluid.

Advantageously, mounting on equipment an electronic assembly as described hereinabove, is facilitated.

Advantageously, the connection of each case to the fluid distribution structure is facilitated, no additional part being needed for ensuring the circulation of the heat-transfer fluid.

The invention is applicable to any type of electronic component, in particular semiconductor components, e.g., components made of gallium nitride GAN, silicon carbide (SiC) or silicon.

In a particular embodiment, the electronic component is a microwave power amplifier, used, e.g., in radar transmitters/receivers.

The invention claimed is:

1. A case for packaging electronic component(s), the case forming a housing for receiving at least one electronic component, the case comprising:

a support wall for the at least one electronic component comprising:
- an inner face receiving the at least one electronic component; and
- an outer face; and lateral edges, the support wall and the lateral edges being made of a first material;

at least one electrical connection element extending towards the outside of the case; and a microfluidic cooling device made of a second material, inserted into said support wall, the microfluidic cooling device comprising:
- at least one channel for circulation of a heat-transfer fluid connected to an inlet port for the heat-transfer fluid and to an outlet port for the heat-transfer fluid; and
- at least one platform for receiving the at least one electronic component in contact with said at least one channel, the platform having a parallelepipedal geometric shape, protruding towards the inside of the case, forming a promontory for receiving the at least one electronic component.

2. An electronic assembly comprising:

at least one case according to claim 1; and a support structure integrating a fluid distribution towards said at least one case, each case including an electronic component either brazed or bonded to the interior of the case, in contact with the cooling device of the case.

3. The assembly according to claim 2, wherein said support structure comprises channels for the distribution of heat-transfer fluid, one of said heat-transfer fluid distribution channels being connected to the inlet port of each cooling device and another of said heat-transfer fluid distribution channels being connected to the outlet port of each cooling device, each case being bonded by the outer face of the support wall of the case to said support structure.

4. The case according to claim 1, wherein said cooling device is attached by brazing to said first support wall.

5. The case according to claim 1, wherein the second material of which said cooling device is made of silicon.

6. The case according to claim 5, further comprising a heat exchanger wherein is formed, by micro-machining said at least one channel.

7. The case according to claim 6, wherein said heat exchanger comprises:

fins arranged in parallel; and channels for the circulation of a heat-transfer fluid formed between said fins.

8. The case according to claim 6, wherein said heat exchanger comprises:

pins arranged in parallel; and circulation channels for the heat-transfer fluid formed between said pins.

9. The case according to claim 1, wherein the first material is a ceramic or metallic material or a composite material.

10. The case according to claim 1, wherein the inlet and outlet ports open towards said outer face of said support wall.

11. The case according to claim 1, wherein each platform has dimensions substantially equal to the dimensions of an electronic component, the electronic component being either brazed or bonded to the platform.

* * * * *